(12) United States Patent
Hazelton

(10) Patent No.: US 7,193,683 B2
(45) Date of Patent: Mar. 20, 2007

(54) STAGE DESIGN FOR REFLECTIVE OPTICS

(75) Inventor: Andrew J. Hazelton, Yokohama (JP)

(73) Assignee: Nikon Corporation, Tokyo (JP)

( * ) Notice: Subject to any disclaimer, the term of this patent is extended or adjusted under 35 U.S.C. 154(b) by 136 days.

(21) Appl. No.: 11/031,372

(22) Filed: Jan. 6, 2005

(65) Prior Publication Data

US 2006/0146303 A1 Jul. 6, 2006

(51) Int. Cl.
*G02B 27/42* (2006.01)
*G03B 27/58* (2006.01)
*G03B 27/62* (2006.01)

(52) U.S. Cl. .............................. 355/53; 355/72; 355/75

(58) Field of Classification Search .................. 355/53, 355/72–76; 310/10, 12; 318/640; 378/34, 378/35

See application file for complete search history.

(56) References Cited

U.S. PATENT DOCUMENTS

| | | | |
|---|---|---|---|
| 5,208,497 A | 5/1993 | Ishii et al. | |
| 5,285,995 A | 2/1994 | Gonzalez et al. | |
| 5,385,217 A | 1/1995 | Watanabe et al. | |
| 5,440,997 A | 8/1995 | Crowley | |
| 5,815,246 A | 9/1998 | Sperling et al. | |
| 6,252,234 B1 | 6/2001 | Hazelton et al. | |
| 6,262,794 B1 | 7/2001 | Miyajima | |
| 6,337,484 B1 | 1/2002 | Loopstra et al. | |
| 6,359,678 B1* | 3/2002 | Ota | 355/53 |
| 6,597,429 B2 | 7/2003 | Janssen et al. | |
| 6,601,519 B1 | 8/2003 | Bindloss et al. | |
| 6,629,503 B2 | 10/2003 | Post | |
| 6,671,036 B2* | 12/2003 | Kwan | 355/72 |
| 6,894,763 B2* | 5/2005 | Murakami et al. | 355/53 |
| 2004/0119436 A1* | 6/2004 | Binnard et al. | 318/649 |

FOREIGN PATENT DOCUMENTS

| | | |
|---|---|---|
| JP | 02266134 | 10/1990 |
| JP | 10-326747 | 8/1998 |
| WO | WO98/28665 | 7/1998 |
| WO | WO98/40791 | 9/1998 |
| WO | WO99/27569 | 6/1999 |

OTHER PUBLICATIONS

ASPE 2000 Technical Session Abstracts (Session III: Lithography) American Society For Precision Engineering "Technical Session Abstracts Session III: Lithography" (5 pages) http://www.aspe.net/meetings/2000annual/abstracts/tech3_litho.html.

(Continued)

*Primary Examiner*—Henry Hung Nguyen
(74) *Attorney, Agent, or Firm*—Beyer Weaver LLP

(57) ABSTRACT

A lithography apparatus including a reticle stage, a wafer stage, and an actuator. The reticle stage is operable to project an original image. A final image corresponding to the original image is formed on the wafer stage. The actuator is operable to actuate the reticle stage at a first acceleration and the wafer stage at a second acceleration. The first acceleration and the second acceleration are in colinear and opposite directions.

16 Claims, 4 Drawing Sheets

OTHER PUBLICATIONS

Douglas C. Watson, et al. "Stage Assembly Including A Reaction Assembly" U.S. Appl. No. 09/713,911, filed Nov. 16, 2000, PA0 283; 00/04574 (U.S. Patent No. 6,593,997) 55 Pages.

Mike Binnard, et al. "System and Method for Resetting A Reaction Mass Assembly Of A Stage Assembly" U.S. Appl. No. 09/714,598, filed Nov. 16, 2000, PA0 293; 00/04572-US-0 (Abandoned Dec. 3, 2003) 89 Pages.

Andrew J. Hazelton, et al. "Stage Assembly Including A Reaction Mass Assembly" U.S. Appl. No. 09/714,747, filed Nov. 16, 2000, PA0 287; 00/4573 (U.S. Patent No. 6,575,053) 94 Pages.

Bausan Yaun, et al. "Reaction Mass For A Stage Device" U.S. Appl. No. 09/759,524, filed Jan. 16, 2001, PA0 247; 00/04535-US-0 54 Pages.

Andrew J. Hazelton, "Reaction Force Isolation System" U.S. Appl. No. 09/773,891, filed Feb. 2, 2001, PA0 206 2 CIP; 00/04418-US-2, (Abandoned Sep. 1, 2004). 25 Pages.

Andrew J. Hazelton, "Reaction Force Isolation System For A Planar Motor" U.S. Appl. No. 09/870,518, filed Jun. 1, 2001, PA0 206 1 CIP; (Abandoned Jun. 1, 2001) 41 Pages.

* cited by examiner

STAGE DESIGN FOR REFLECTIVE OPTICS

BACKGROUND OF THE INVENTION

The present invention relates generally to a stage design for an optical system, and more specifically to methods and apparatus for a lithography apparatus used for semiconductor process.

Current integrated circuit (IC) manufacturing practices use lithography photomasks (reticles) to apply various patterns to a photosensitized semiconductor wafer used to create the ICs. Reticles are typically high-precision plates that contain a pattern of extremely small images of the various components of an electronic circuit. A reticle is used as a master to transfer the circuit pattern onto a photosensitized wafer. Current state-of-the-art lithographic systems often must position an ultra-fine image to within 15 nanometers. Current circuit architectures often have conductor linewidths as narrow as 30 nanometers. Accordingly, lithography processing equipment requires advanced precision optical and mechanical systems, and even higher precision systems will be required in the future, as still smaller images become common.

Lithographic exposure apparatuses are used to project images from the reticle onto the photosensitized wafer during semiconductor processing. A typical exposure apparatus includes a base frame having a lower enclosure that contains a wafer stage for holding a semiconductor wafer workpiece. The base frame also supports an optical device that holds a reticle stage and is arranged to project the images from a reticle carried by the reticle stage onto the wafer workpiece. The base frame typically supports the optical device through a vibration isolation system designed to damp and isolate vibrations between components of exposure apparatus so that vibrations in one component are not transmitted to the other.

However, when scanning the reticle to project an image onto the wafer, one or more actuators actuate a reticle stage and a wafer stage synchronously. Since both the reticle stage and the wafer stage have mass, reaction forces are generated. A potential problem with actuating the reticle stage and the wafer stage is that the reaction forces tend to cause vibration to other elements in the system, thus deteriorating the precision of the imaging.

As such, it becomes increasingly necessary to devise a system that provides low reaction forces generated by the actuation of the reticle stage and the wafer stage, thus avoiding the transmission of vibrations to other elements of the system.

SUMMARY OF THE INVENTION

The present invention addresses the needs described above by providing methods and apparatus which reduce or substantially cancel the reaction forces caused by moving a reticle stage and a wafer stage. Since the reaction forces are reduced or substantially canceled, the embodiments of the present invention prevent vibration from being transmitted to other elements of the system or transmitted outside of the system, such as a photolithography system, thereby remaining unaffected by vibrations, which would deteriorate the photolithography process.

In one embodiment, the lithography apparatus includes a reticle stage, a wafer stage, and an actuator. The reticle stage is operable to project an original image. A final image corresponding to the original image is formed on the wafer stage. The actuator is operable to actuate the reticle stage at a first acceleration and the wafer stage at a second acceleration. The first acceleration and the second acceleration are in colinear and opposite directions. In a specific embodiment, a ratio of a wafer stage mass to a reticle stage mass is substantially the same as a ratio of the first acceleration to the second acceleration. The lithography apparatus may provide the actuator between the reticle stage and the wafer stage.

In another embodiment, the lithography apparatus further includes another actuator and a counterweight. The actuator and the another actuator actuate the reticle stage, the wafer stage, and the counterweight. The actuation of the reticle stage creates a first reaction force. The actuation of the wafer stage creates a second reaction force. The actuation of the counterweight creates a third reaction force. The first, second and third reaction forces are substantially canceled by each other.

Another embodiment of the present invention provides a method of performing lithography. According to the embodiment, an original image is projected from a reticle stage. A final image corresponding to the original image is formed on a wafer stage. The reticle stage is actuated at a first acceleration and the wafer stage is actuated at a second acceleration. The first acceleration and the second acceleration are in colinear and opposite directions. In a more specific embodiment, a counterweight is actuated. The actuation of the reticle stage creates a first reaction force. The actuation of the wafer stage creates a second reaction force. The actuation of the counterweight creates a third reaction force. The first, second and third reaction forces are substantially canceled by each other.

A further understanding of the nature and advantages of the present invention may be realized by reference to the remaining portions of the specification and the drawings.

BRIEF DESCRIPTION OF THE DRAWING

The invention, together with further objects and advantages thereof, may best be understood by reference to the following description taken in conjunction with the accompanying drawings in which.

DETAILED DESCRIPTION OF SPECIFIC EMBODIMENTS

Various embodiments of the present invention will now be described in detail with reference to the drawings, wherein like elements are referred to with like reference labels throughout.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 4:
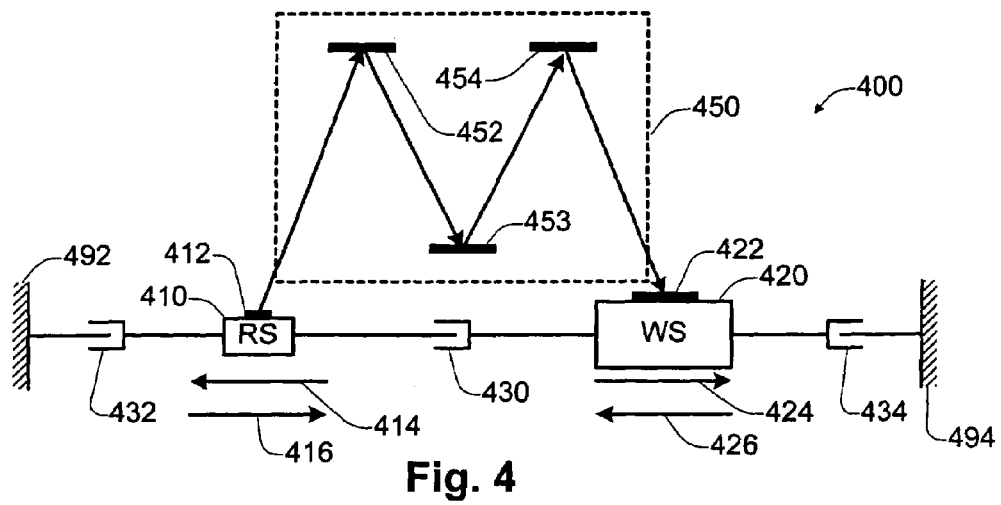
FIG. 4 is a schematic diagram of one embodiment according to the present invention.

FIG. 4 is a schematic diagram of one embodiment according to the present invention. A lithography apparatus 400 includes a reticle stage 410 capable of holding a reticle (or, a mask) 412, a wafer stage 420 capable of holding a wafer 422, actuators 430, 432 and 434, and an optical system 450.

The reticle stage 41 projects an original image from the reticle 412. A final image corresponding to the original image from the reticle 412 is formed on the wafer 422 held on the wafer stage 420.

The actuators 430, 432 and 434 actuate the reticle stage 410 and the wafer stage 420 so that the reticle stage 410 and the wafer stage 420 are moved synchronously in order to scan the reticle 412 and project the image of the reticle 412 onto the wafer 422 for patterning the wafer 422. In various embodiments of the present invention, the actuator 430 actuates the reticle stage 412 at a first acceleration a1 and the wafer stage 420 at a second acceleration a2. The first acceleration a1 and the second acceleration a2 are substantially in colinear and opposite directions. It is noted that, in this specification, the first and second accelerations are vectors, rather than scalars.

In this specific embodiment, the first acceleration a1 and the second acceleration a2 are substantially in a same plane. For example, when the reticle stage 410 moves in a direction 414, the wafer stage 420 moves in a direction 424.

Conversely, when the reticle stage 410 moves in a direction 416, the wafer stage 420 moves in a direction 426.

Figure 5:
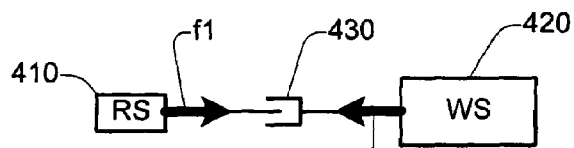
FIG. 5 is a schematic diagram for illustrating the two accelerations which are in colinear and opposite directions used for one embodiment according to the present invention.

FIG. 5 is a schematic diagram for illustrating the two accelerations which are in colinear and opposite directions used for one embodiment according to the present invention. In this specification, as indicated in FIG. 5, the term "in colinear and opposite directions" represents a relationship of two accelerations which are substantially in a same axis and in opposite directions.

In one specific embodiment, a ratio of a wafer stage mass m2 to a reticle stage mass m1 is substantially the same as a ratio of the first acceleration a1 to the second acceleration a2. In other words, the following expression is satisfied:

$$m2/m1 \cong a1/a2 \quad (1).$$

In this case, the reaction force f1 generated by the actuation of the reticle stage 410, and the reaction force f2 generated by the actuation of the wafer stage 420 are expressed as follows:

$$f1 = m1 \cdot a1, \text{ and}$$

$$f2 = m2 \cdot a2, \quad (2)$$

where
m1=a mass of the reticle stage 410, and
m2=a mass of the wafer stage 420.

If the equation $$f1 + f2 = 0$$

is satisfied, then the reaction forces are canceled. Here, the following relationship (3) is derived from the equations (1) and (2):

$$m1 \cdot a1 + m2 \cdot a2 = 0 \quad (3)$$

Since the forces f1 and f2 are substantially in colinear and opposite directions as indicated in FIG. 5, the reaction forces f1 and f2 are substantially canceled by each other. As a result, various embodiments according to the present invention reduce or substantially cancel the reaction forces f1 and f2 caused by moving the reticle stage 410 and the wafer stage 420. Since the reaction forces f1 and f2 are reduced or substantially canceled, the embodiments of the present invention prevent vibration from being transmitted to other elements of the system 400 or transmitted outside of the system 400, thereby allowing the system to be unaffected by vibrations, which would deteriorate the photolithography process.

In the equation (3), the masses m1 and m2 are scalars, and the accelerations a1 and a2 are vectors. Thus, for example, if the acceleration a1 toward the right-hand side in FIG. 5 has a plus ("+") sign, then the acceleration a2 toward the left-hand side in FIG. 5 has a minus ("−") sign.

For example, in some specific embodiments, the following relationship is satisfied:

$$3 < m2/m1 < 5, \text{ and}$$

$$3 < a1/a2 < 5.$$

In a more specific embodiment, the relationship $m2/m1 \cong a1/a2 \cong 4$ is satisfied.

In some embodiments, the optical system 450 is provided between the reticle stage 410 and the wafer stage 420, and includes one or more mirrors or reflective optical elements 452–454. One of the mirrors 452–454 may be a retroreflective mirror. Alternatively, the optical system 450 may include one or more lenses instead. Further alternatively, the optical system 450 may use any suitable combination of one or more mirrors, and one or more lenses for re-imaging the final image corresponding to the original image from the reticle 412 onto the wafer 422.

In this specific embodiment, the actuator 430 which is provided between the reticle stage 410 and the wafer stage 420 actuates the reticle stage 410 and the wafer stage 420. However, in some embodiments, the actuators 432 and 434 may contribute to the actuation of the reticle stage 410 and the wafer stage 420 in addition to the actuation by the actuator 430. Both the actuators 432 and 434 function as trim actuators and are coupled to reference frames 492 and 494, respectively. For example, the actuators 432 and 434 may actuate the reticle stage 410 and the wafer stage 420 at the first acceleration a1 and the second acceleration a2, respectively, which are in colinear and opposite directions.

Figure 6:
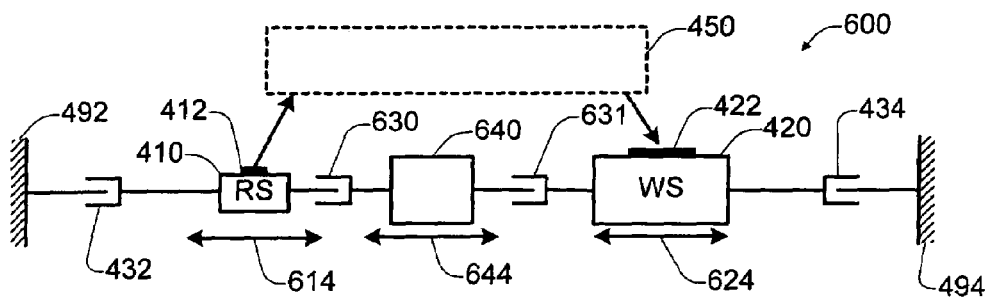
FIG. 6 is a schematic diagram of another embodiment according to the present invention.

FIG. 6 is a schematic diagram of another embodiment according to the present invention. A lithography apparatus 600 includes the reticle stage 410, the wafer stage 420, actuators 432, 434, 630 and 631, a counterweight 640, and an optical system 450. In this embodiment, a series connection of the actuator 630, the counterweight 640, and the actuator 631 are provided between the reticle stage 410 and the wafer stage 420 to actuate the reticle stage 410, the counterweight 640, and the wafer stage 420.

Suppose that the actuation of the reticle stage 410 creates a first reaction force 614, the actuation of the wafer stage 420 creates a second reaction force 624, and the actuation of the counterweight 640 creates a third reaction force 644. According to the embodiment, the first reaction force 614, the second reaction force 624, and the third reaction force 644 are substantially canceled by each other. As a result, similar to the embodiment shown in FIGS. 4 and 5, the embodiment of FIG. 6 is capable of preventing vibration from being transmitted to other elements of the system 600 or transmitted outside of the system 600.

Figure 7:
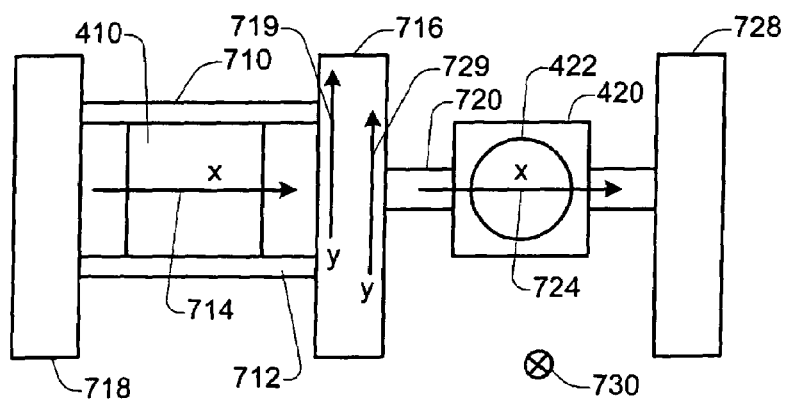
FIG. 7 is a plan view of one embodiment according to the present invention.

FIG. 7 is a plan view of one embodiment according to the present invention. In this specific embodiment, the reticle stage 410 and the wafer stage 420 are actuated by at least one actuator (not shown) with two degrees of freedom to shift the position of the final image on the wafer 422. The reticle stage 410 is slidably supported by support rails 710 and 712 along a first direction 714. The support rails 710 and 712 are slidably supported by support rails 716 and 718 along a second direction 719. The wafer stage 420 is slidably supported by a support rail 720 along a third direction 724. The support rail 720 is slidably supported by support rails 716 and 728 along a fourth direction 729.

In one embodiment the sum of the reaction forces of the reticle stage 410 cancel the sum of the reaction forces of the wafer stage 420. In more specific embodiment, a reaction force of the reticle stage 410 along the first direction 714 is substantially cancelled by a reaction force of the wafer stage 420 along the third direction 724, which is substantially colinear with the first direction 714. In such a case, the acceleration of the reticle stage 410 along the first direction 714 would be in the opposite direction and colinear to the acceleration of the wafer stage 420 in the third direction 724. Similarly, a reaction force of the reticle stage 410 along the second direction 719 is substantially cancelled by a reaction force of the wafer stage 420 along the fourth direction 729, which is substantially colinear with the first direction 714. In such a case, the acceleration of the reticle stage 410 along the second direction 719 would be in the opposite direction and colinear to the acceleration of the wafer stage 420 in the fourth direction 729.

As indicated below by using equations, the reaction forces and the accelerations which are in an opposite direction of the above-mentioned directions 714, 719, 724, and 729 are represented by a symbol "minus." For example, when the reaction forces f1 and f2 satisfies f1+f2=0, the reaction forces are balanced, and thus, canceled by each other. Therefore, the arrows of the directions 714, 719, 724, and 729 do not mean that the reaction forces and the accelerations are only allowed in those directions. For example, the reaction force or acceleration of the reticle stage 410 may be one in the opposite direction of the arrows 714 and 719 (i.e., toward the left and toward the bottom of FIG. 7).

In other words, the reaction force f1x of the reticle stage 410 along the direction 714 is substantially canceled by the reaction force f2x of the wafer stage 420 along the direction 724 if the following equation is satisfied:

$$f1x+f2x=0,$$

where f1x: the reaction force of the reticle stage 410 along the direction 714, and f2x: the reaction force of the wafer stage 420 along the direction 724.

This equation is modified as follows:

$$m1 \cdot a1x+m2 \cdot a2x=0, \quad (4)$$

where m1: the mass of the reticle stage 410, a1x: the acceleration of the reticle stage 410 along the x direction 714, m2: the mass of the wafer stage 420, and a2x: the acceleration of the wafer stage 420 along the x direction 724.

Therefore, in some embodiments, if the reaction forces are canceled in the x component as indicated in the equation (4), the embodiments are capable of obtaining at least part of the advantage of the present invention, e.g., reducing vibrations generated by the reaction forces when the reticle stage and the wafer stage are moved.

Similarly, with respect to the other direction, the reaction force f1y of the reticle stage 410 along the direction 719 is substantially canceled by the reaction force f2y of the wafer stage 420 along the direction 729 if the following equation is satisfied:

$$f1y+f2y=0,$$

where f1y: the reaction force of the reticle stage 410 along the direction 719, and f2y: the reaction force of the wafer stage 420 along the direction 729.

This equation is modified as follows:

$$m1 \cdot a1y+m2 \cdot a2y=0, \quad (5)$$

where m1: the mass of the reticle stage 410, a1y: the acceleration of the reticle stage 410 along the y direction 719, m2: the mass of the wafer stage 420, and a2y: the acceleration of the wafer stage 420 along the y direction 729.

Furthermore, the above-described relationships regarding the reaction forces and the acceleration may be applied to a three dimensional cancellation of the reaction forces. Suppose that there is a z direction 730 perpendicular to the sheet of FIG. 7 in a direction from the back of the sheet of FIG. 7 to the front of the sheet. When similar equations with respect to the direction z are satisfied, the reaction forces along the z direction are canceled. Such an equation is expressed as follows:

$$f1z+f2z=0, \text{ i.e.,}$$

$$m1 \cdot a1z+m2 \cdot a2z=0 \quad (6)$$

where m1: the mass of the reticle stage 410, a1z: the acceleration of the reticle stage 410 along the z direction 730, m2: the mass of the wafer stage 420, and a2z: the acceleration of the wafer stage 420 along the z direction 730.

Various embodiments of the present invention may utilize the cancellation of the reaction forces in systems having one or more degrees of freedom. Such a system having one degree of freedom is illustrated in FIG. 4, and one having two degrees of freedom is illustrated in FIG. 7.

It should be appreciated, however, that in some embodiments, with respect to at least one of the x, y and z components, the reaction forces are colinear and opposite, and thus, canceling each other. Stated differently, in some embodiments, the reaction forces do not necessarily have to be canceled with respect to all the components x, y and z.

That is to say, embodiments of the invention do not necessarily satisfy all of the equations (4)–(6). Some embodiments may satisfy only one of the equations (4)–(6).

As described above, embodiments of the lithography apparatus according to the present invention are capable of making an object, or patterning a wafer without being affected by vibration caused by actuating the reticle stage 410 and the wafer stage 420 since the reaction forces generated by the actuation are substantially reduced or canceled.

Now referring back to FIG. 1, one exemplary lithographic exposure that incorporates the present invention will be briefly described. A typical exposure apparatus 100 includes a mounting base 102, a support frame 104, a base frame 106, a measurement system 108, a control system (not shown), an illumination system 110, an optical frame 112, an optical device 114, a reticle stage 116 for retaining a reticle 118, an upper enclosure 120 surrounding reticle stage 116, a wafer stage 122, a wafer table 123 for retaining a semiconductor wafer workpiece 124, and a lower enclosure 126 surrounding wafer stage 122.

The support frame 104 typically supports base frame 106 above mounting base 102 through a base vibration isolation system 128. Base frame 106 in turn supports optical frame 112, measurement system 108, upper enclosure 120, wafer stage 122, wafer table 123, and lower enclosure 126. Optical frame 112 in turn supports optical device 114 and reticle stage 116. As a result thereof, optical frame 112 and its supported components and base frame 106 are effectively attached in series through base vibration isolation system 128 and optical vibration isolation system 130 to mounting base 102. Vibration isolation systems 128 and 130 are designed to damp and isolate vibrations between components of exposure apparatus 100. Measurement system 108 monitors the positions of stages 116 and 122 relative to a reference such as optical device 114 and outputs position data to the control system. Optical device 114 typically includes a lens assembly that projects and/or focuses the light or beam from an illumination system 110 that passes through reticle 118. Reticle stage 116 is attached to one or more movers (not shown) directed by the control system to precisely position reticle 118 relative to optical device 114. Similarly, wafer stage 122 includes one or more movers (not shown).to precisely position the wafer workpiece 124 with wafer table 123 relative to optical device (lens assembly) 114.

Wafer table 123 moves relative to wafer stage 122 by the mover (for example, electromagnetic actuator utilizing Lorentz type force) for leveling and focusing motions of wafer workpiece 124. The actuator may include a plurality of actuators disposed between wafer stage 122 and wafer table 123 so that wafer table 123 can move relative to wafer stage 122 in six degrees of freedom (X, Y, Z, θx, θy, θz). The wafer stage 122 and the wafer table 123 may have a shielding member that shields magnetic fields generated by the magnetic materials of the anti-gravity mount 400 so that the magnetic fields do not adversely affect the devices mounted around the wafer stage 122 and the wafer table 123. Further, air bellows may be utilized to support wafer table 123 relative to wafer stage 122 in addition to the anti-gravity mount 400 of this invention. This embodiment of the present invention may be utilized for reticle stage 116 in addition to wafer stage 122 by providing a reticle table that retains reticle 118 and moves relative to stage 116.

As will be appreciated by those skilled in the art, there are a number of different types of photolithographic devices. For example, exposure apparatus 100 can be used as a scanning type photolithography system which exposes the pattern from reticle 118 onto wafer 124 with reticle 118 and wafer 124 moving synchronously. In a scanning type lithographic device, reticle 118 is moved perpendicular to an optical axis of optical device 114 by reticle stage 116 and wafer 124 is moved perpendicular to an optical axis of optical device 114 by wafer stage 122. Scanning of reticle 118 and wafer 124 occurs while reticle 118 and wafer 124 are moving synchronously.

Alternately, exposure apparatus 100 can be a step-and-repeat type photolithography system that exposes reticle 118 while reticle 118 and wafer 124 are stationary. In the step and repeat process, wafer 124 is in a constant position relative to reticle 118 and optical device 114 during the exposure of an individual field. Subsequently, between consecutive exposure steps, wafer 124 is consecutively moved by wafer stage 122 perpendicular to the optical axis of optical device 114 so that the next field of semiconductor wafer 124 is brought into position relative to optical device 114 and reticle 118 for exposure. Following this process, the images on reticle 118 are sequentially exposed onto the fields of wafer 124 so that the next field of semiconductor wafer 124 is brought into position relative to optical device 114 and reticle 118.

However, the use of exposure apparatus 100 provided herein is not limited to a photolithography system for a semiconductor manufacturing. Exposure apparatus 100, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines. The present invention is desirable in machines where it is desirable to prevent the transmission of vibrations.

The illumination source (of illumination system 110) can be g-line (436 nm), i-line (365 nm), KrF excimer laser (248 nm), ArF excimer laser (193 nm) and $F_2$ laser (157 nm). Alternatively, the illumination source can also use charged particle beams such as x-ray and electron beam. For instance, in the case where an electron beam is used, thermionic emission type lanthanum hexaboride ($LaB_6$,) or tantalum (Ta) can be used as an electron gun. Furthermore, in the case where an electron beam is used, the structure could be such that either a mask is used or a pattern can be directly formed on a substrate without the use of a mask.

With respect to optical device 114, when far ultra-violet rays such as the excimer laser is used, glass materials such as quartz and fluorite that transmit far ultra-violet rays is preferably used. When the $F_2$ type laser or x-ray is used, optical device 114 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid- Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 2:
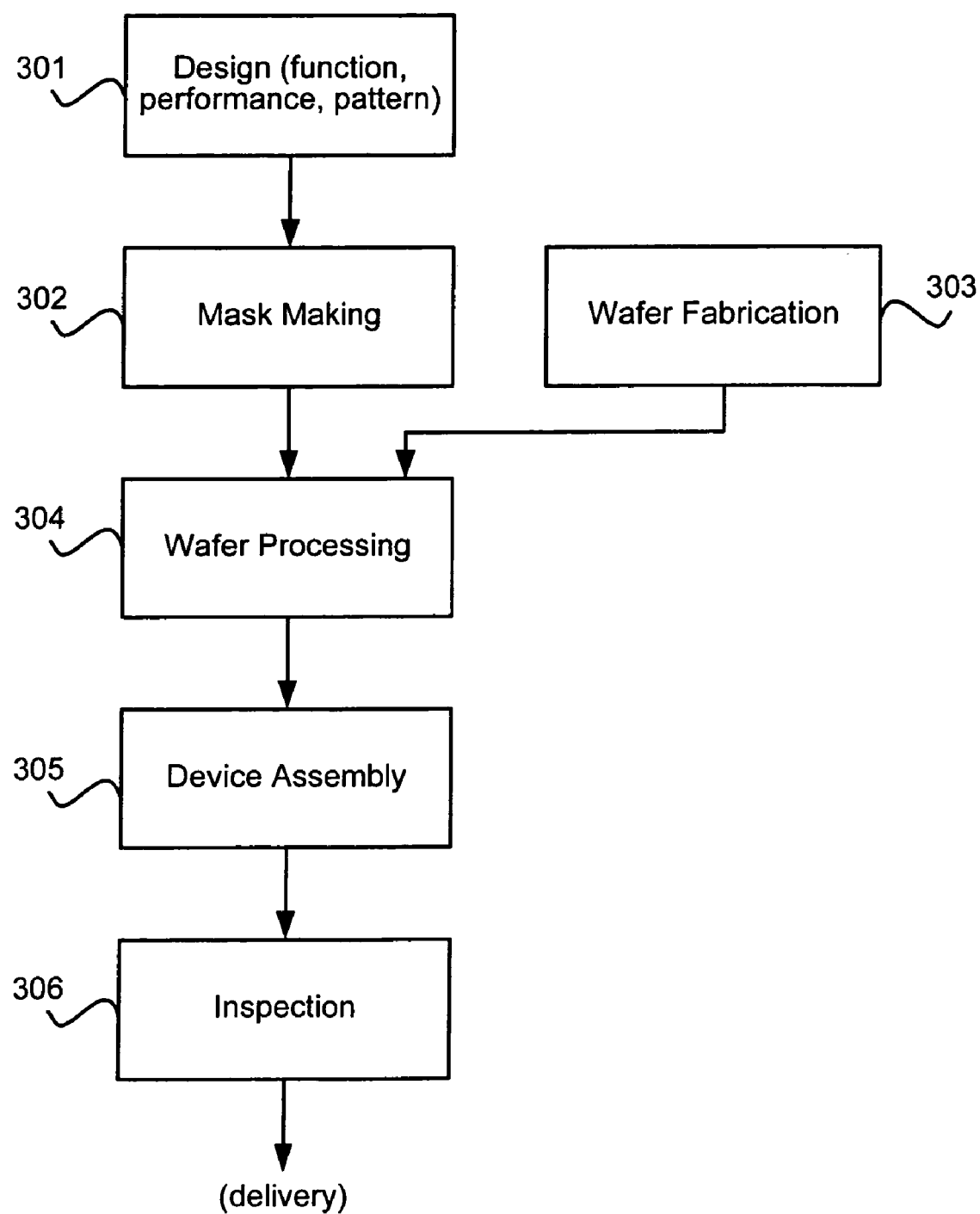
FIG. 2 is a process flow diagram illustrating an exemplary process by which semiconductor devices are fabricated using the systems shown in FIG. 1 according to the present invention.

Further, semiconductor devices can be fabricated using the above described systems, by the process shown generally in FIG. 2. In step 301, the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system such as the systems described above. In step 305 the semiconductor device is assembled (including the dicing process, bonding process and packaging process), then finally the device is inspected in step 306.

Figure 3:
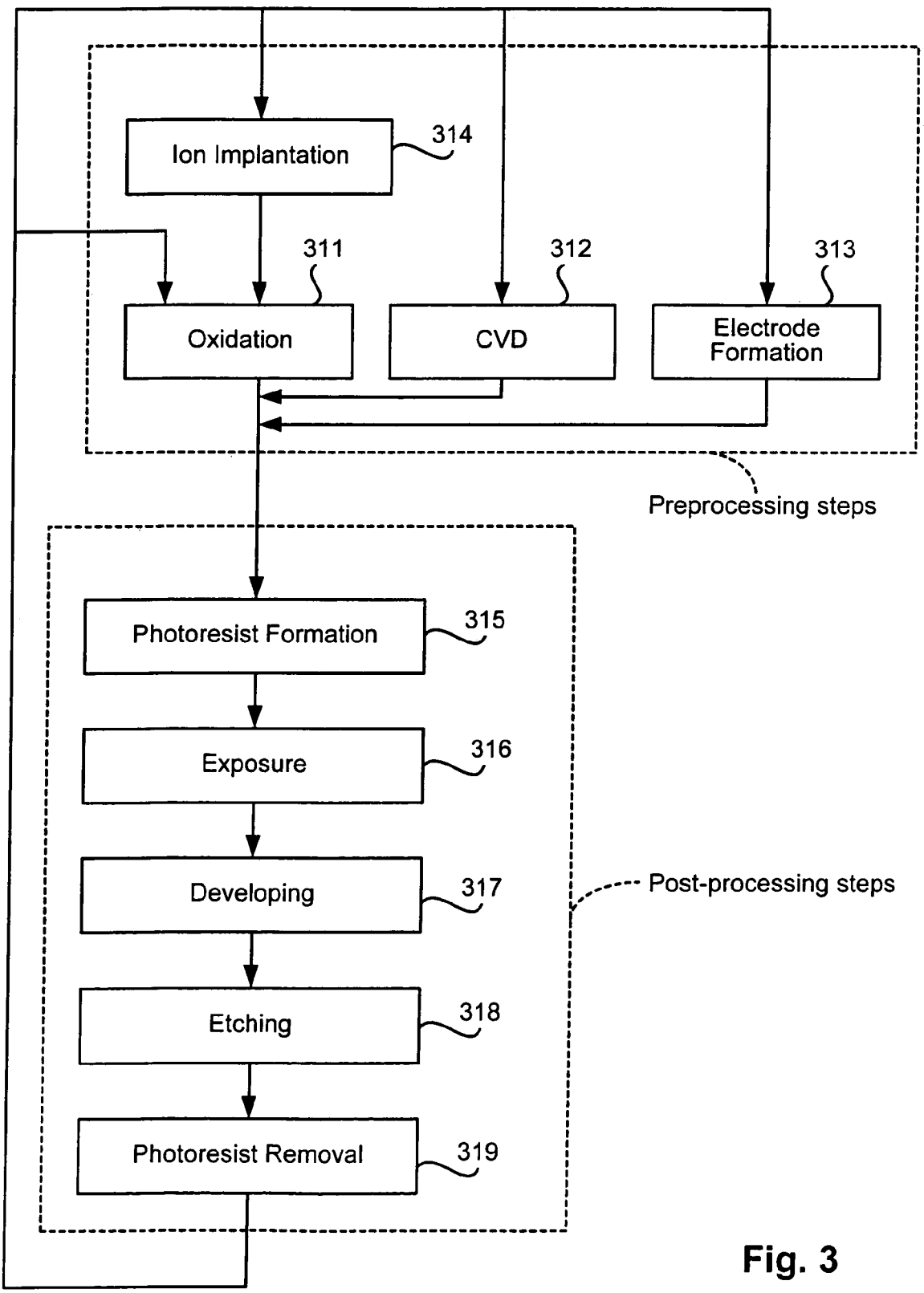
FIG. 3 is a flowchart of the wafer processing step shown in FIG. 2 in the case of fabricating semiconductor devices according to the present invention.

FIG. 3 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

Figure 1:
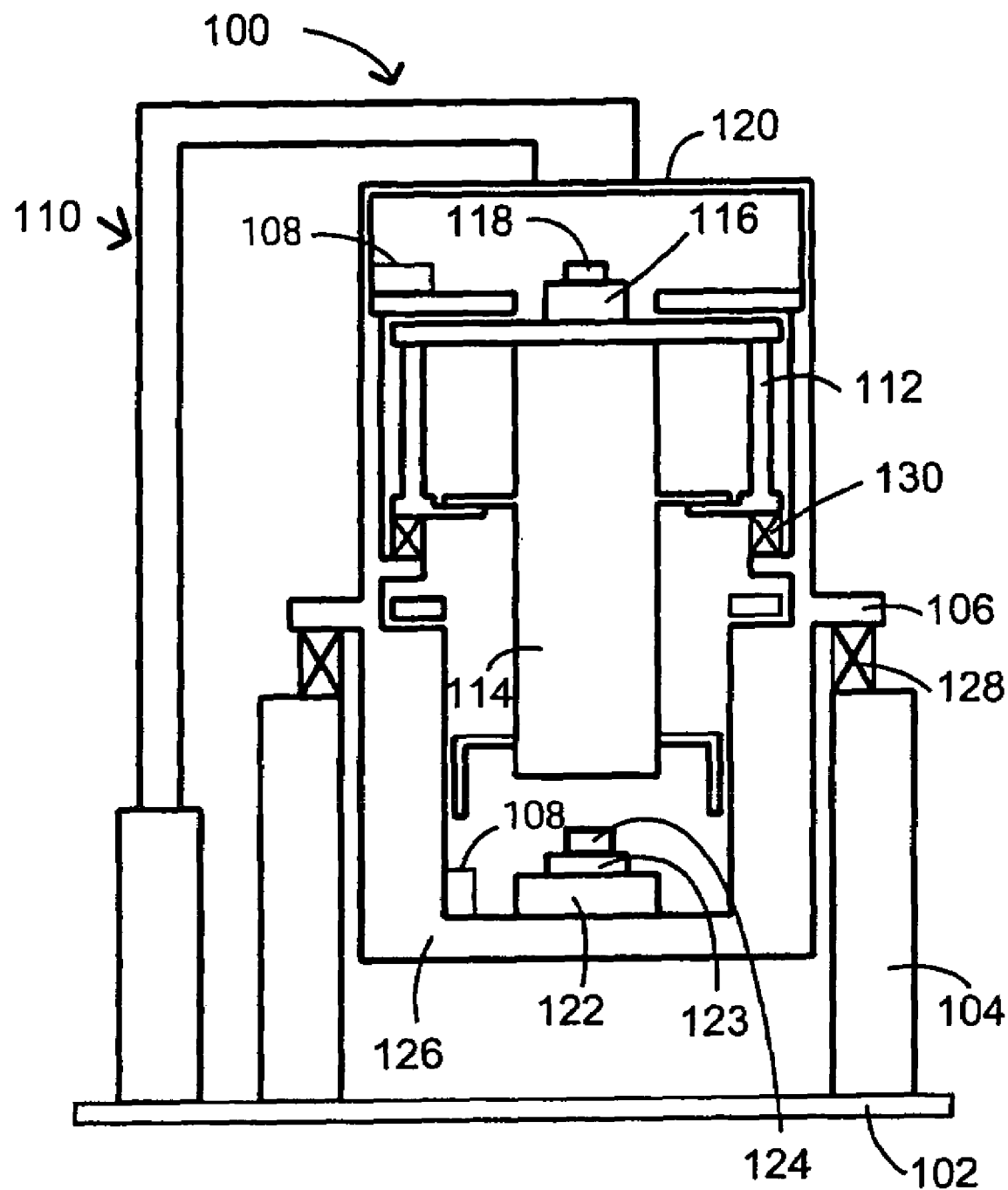
FIG. 1 is a cross-sectional view of an exemplary lithographic exposure apparatus that incorporates the present invention.

It should be appreciated that various embodiments of the present invention described referring to FIGS. 4–7 may be utilized and/or incorporated with apparatus and methods described referring to FIGS. 1–3.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but maybe modified within the scope and equivalents of the appended claims.

What is claimed is:

1. A lithography apparatus, comprising:
    a reticle stage operable to project an original image;
    a wafer stage on which a final image corresponding to the original image is formed; and
    an actuator operable to actuate the reticle stage at a first acceleration and the wafer stage at a second acceleration, wherein
    the first acceleration and the second acceleration are in colinear and opposite directions, and
    wherein the actuator that connects the reticle stage with the wafer stage is provided between the reticle stage and the wafer stage.

2. The lithography apparatus of claim 1, further comprising another actuator and a counterweight, wherein the actuator and the another actuator actuate the reticle stage, the wafer stage, and the counterweight, the actuation of the reticle stage creates a first reaction force, the actuation of the wafer stage creates a second reaction force, the actuation of the counterweight creates a third reaction force, and the first, second and third reaction forces are substantially canceled by each other.

3. The lithography apparatus of claim 1, further comprising a first trim actuator operable to actuate the reticle stage at the first acceleration with respect to a reference frame of the lithography apparatus, and a second trim actuator operable to actuate the wafer stage at the second acceleration with respect to the reference frame.

4. The lithography apparatus of claim 1, wherein the first acceleration and the second acceleration are substantially in a same plane.

5. The lithography apparatus of claim 1, wherein a ratio of a wafer stage mass to a reticle stage mass is substantially the same as a ratio of the first acceleration to the second acceleration.

6. The lithography apparatus of claim 5, wherein the ratio of the wafer stage mass to the reticle stage mass is more than about 3, and less than about 5, and the ratio of the first acceleration to the second acceleration more than about 3, and less than about 5.

7. The lithography apparatus of claim 1, wherein a mirror is provided between the reticle stage and the wafer stage.

8. A method of performing lithography, comprising:
projecting an original image from a reticle stage;
forming a final image corresponding to the original image on a wafer stage;
actuating the reticle stage at a first acceleration and the wafer stage at a second acceleration, and
actuating a counterweight, wherein
the first acceleration and the second acceleration are in colinear and opposite directions,
one end of the counterweight is connected to the reticle stage via a first actuator, and the other end of the counterweight is connected to the wafer stage via a second actuator.
the actuation of the reticle stage creates a first motion force,
the actuation of the wafer stage creates a second reaction force,
the actuation of the counterweight creates a third reaction force, and
the first, second and third reaction forces are substantially canceled by each other.

9. The method of claim 8, wherein the first and second accelerations are provided with respect to a reference frame of the lithography apparatus.

10. The method of claim 8, wherein the first acceleration and the second acceleration are substantially in a same plane.

11. The method of claim 8, wherein a ratio of a wafer stage mass to a reticle stage mass is substantially the same as a ratio of the first acceleration to the second acceleration.

12. The method of claim 11, wherein the ratio of the wafer stage mass to the reticle stage mass is more than about 3, and less than about 5, and the ratio of the first acceleration to the second acceleration more than about 3, and less than about 5.

13. The method of claim 8, wherein a mirror is provided between the reticle stage and the wafer stage.

14. A method for making an object using a lithography process, wherein the lithography process utilizes the method of claim 8.

15. A method for patterning a wafer using a lithography process, wherein the lithography process utilizes the method of claim 8.

16. A lithography apparatus, comprising:
a reticle stage operable to project an original image;
a wafer stage on which a final image corresponding to the original image is formed;
a counterweight; and
an actuator operable to actuate the reticle stage, the wafer stage, and the counterweight; wherein
the actuation of the reticle stage creates a first reaction force, the actuation of the wafer stage creates a second reaction force, the actuation of the counterweight creates a third reaction force, and the first, second and third reaction forces are substantially canceled by each other.

* * * * *

UNITED STATES PATENT AND TRADEMARK OFFICE
CERTIFICATE OF CORRECTION

PATENT NO. : 7,193,683 B2
APPLICATION NO. : 11/031372
DATED : March 20, 2007
INVENTOR(S) : Andrew J. Hazelton Page 1 of 1

It is certified that error appears in the above-identified patent and that said Letters Patent is hereby corrected as shown below:

In the Specification:

Column 3, line 21, change "reticle stage 41" to --reticle stage 410--.

Column 7, line 24, add --through an optical vibration isolation system 130,-- after "supports".

Column 7, line 25, add --reticle stage 116,-- after "system 108".

Column 7, line 25, add --optical device 114,-- after "enclosure 120".

Column 7, line 26, add --above base frame 106-- after "enclosure 126".

Column 7, line 28, add --above base frame 106 through optical vibration isolation system 130-- after "stage 116".

In the Claims:

In line 14 of claim 8 (column 11, line 43) change "motion" to --reaction--.

Signed and Sealed this

Eleventh Day of December, 2007

JON W. DUDAS
*Director of the United States Patent and Trademark Office*